United States Patent
Reineck et al.

(10) Patent No.: US 6,221,493 B1
(45) Date of Patent: Apr. 24, 2001

(54) POST TREATED DIAMOND COATED BODY

(75) Inventors: Ingrid Reineck, Huddinge; Bengt Edholm; Christian Strondl, both of Uppsala, all of (SE)

(73) Assignee: Sandvik AB, Sandviken (SE)

( * ) Notice: Subject to any disclaimer, the term of this patent is extended or adjusted under 35 U.S.C. 154(b) by 0 days.

(21) Appl. No.: 09/242,630
(22) PCT Filed: Oct. 9, 1997
(86) PCT No.: PCT/SE97/01689
§ 371 Date: May 28, 1999
§ 102(e) Date: May 28, 1999
(87) PCT Pub. No.: WO98/15670
PCT Pub. Date: Apr. 16, 1998

(30) Foreign Application Priority Data

Oct. 10, 1996 (SE) .................................................... 9603721

(51) Int. Cl.$^7$ ............................ C23C 16/26; B23B 27/20
(52) U.S. Cl. .......................... 428/408; 264/621; 264/623; 427/249; 427/331; 427/569; 427/577; 427/570; 427/532; 427/533; 427/534; 427/535; 427/539; 427/348; 427/372.2; 428/141; 428/174; 428/323; 428/325; 428/446; 428/469
(58) Field of Search ..................................... 428/408, 469, 428/323, 325, 141, 174, 446; 427/249, 331, 569, 577, 570, 532, 533, 535, 539, 534, 348, 372.2; 264/621, 623

(56) References Cited

U.S. PATENT DOCUMENTS

| | | |
|---|---|---|
| 4,980,021 | 12/1990 | Kitamura et al. . |
| 5,483,084 | 1/1996 | Hirabayashi . |
| 5,500,077 | 3/1996 | Nishibayashi et al. . |
| 5,585,176 | 12/1996 | Grab et al. . |
| 5,648,119 | 7/1997 | Grab et al. . |

OTHER PUBLICATIONS

SPIE, vol. 2286, 1994, Ian Llewellyn et al., "Plasma etching and deposition as a method of polishing CVD diamond"pp. 198–204, (no month).
Nonferrous Metals, vol. 107, No. 26, 1987, pp. 283 (no month).
Derwent Abstract #J62158864, May 11, 1994.
English Abstract of JP 62–158864, Jul. 14, 1987.

*Primary Examiner*—Archene Turner
(74) *Attorney, Agent, or Firm*—Burns, Doane, Swecker & Mathis, L.L.P.

(57) ABSTRACT

According to the present invention there is now provided a body of cemented carbide or cermets coated with at least one diamond layer. The diamond layer is smooth on all sides of the body with an $R_a<1$ μm. According to the present invention there is also provided a method for reactive ion etching of a diamond layer on a complex shape body where the etching is efficient at all sides of the body exposed to the plasma. The etching is made using a C— or oxygen-containing plasma with the possibility of etching of a diamond layer covered by an outer layer of preferably a Si containing material.

20 Claims, 1 Drawing Sheet

(a)

(b)

POST TREATED DIAMOND COATED BODY

BACKGROUND OF THE INVENTION

The present invention relates to a diamond coated body for which the diamond layer is smoothened which increases its wear and flaking resistance, in particular to be used as a cutting tool for cutting Al-alloys containing e.g. Si and Cu as alloying elements and the like.

After many years of research efforts, the production of thin layers of diamond directly from the gas phase by CVD plasma technique for coating of cutting tools has been realized. Gas phase deposition of diamond on cemented carbide tools has been assessed by a variety of methods where the tailoring of the cemented carbide has proven to be of great importance.

The predominant growth manner for CVD plasma diamond layers is that the grain size grows markedly with deposition time. Typically, for a 6–10 $\mu$m thick diamond layer, the diamond grain size is 2–5 $\mu$m giving a surface roughness in this regime. One way to avoid the increase in grain size by growth time is to apply a bias voltage onto the tools which gives a smooth diamond surface but with the risk of achieving a deteriorated diamond quality. Besides, large scale production involving biasing puts demands on careful and hence more elaborate fixturing.

Smoothening of the diamond layers is generally regarded as being beneficial in cutting applications since the cutting forces are reduced upon lowering the coefficient of friction. Measurements of the coefficient of friction have shown that a much lower value is obtained for a polished CVD diamond layer compared to an as-deposited layer. A method for achieving a smooth diamond layer on cutting tools is mechanical polishing but due to the three-dimensional and often complicated shape, the polishing has only been possible to apply on flat rake surfaces or on a small part of the flank just below the cutting edge.

Polishing of diamond layers for electronic purposes, i.e. diamond layers on flat Si wafers and the like is known from the literature (see e.g. U.S. Pat. No. 5,500,077). The methods applied have been, for example, reactive ion etching using RF plasma generation with different gases such as $O_2$, $CF_4$ etc. A highly efficient etching process is described in Llewellyn et. al., SPIE Vol.2286, (1994) 198–204, still only for a two-dimensional set-up. Reactive ion etching (RIE) constitutes a combination of a chemical reaction and physical ion bombardment of a surface. Typical for RIE as compared with plasma etching in general is that the ion energies are high, this due to a low pressure during the process (<100 mTorr).

OBJECTS AND SUMMARY OF THE INVENTION

It is an object of this invention to avoid or alleviate the problems of the prior art.

It is further an object of this invention to provide a diamond coated body to be used as a cutting tool.

In one aspect of the invention there is provided a body of cemented carbide or cermet coated with at least one diamond layer wherein the surface roughness of the diamond layer at all of the sides, the intersections of which generate cutting edges, is less than 1 $\mu$m.

In another aspect of the invention there is provided a method for producing a smooth diamond layer on a complex shaped body comprising diamond coating the said body and then etching in a reactive ion etching device using RF plasma whereby the etching takes place at all sides of the body that are exposed to the plasma.

DETAILED DESCRIPTION OF THE PREFERRED EMBODIMENTS OF THE INVENTION

It is surprising to find that reactive ion etching of diamond can be achieved for diamond layers on cemented carbide or cermet bodies of complex, three-dimensional shapes, such as cutting tools including chip-breakers on the top surface so as to provide chips formed during machining in a desired and controllable configuration. This is in particular so since the etching per se is most efficient at protruding parts where a higher electric field strength is present. Cutting tool inserts prepared in this way have been found to generate a higher workpiece surface finish and to have a longer life-time in Al-alloy machining operations compared to as-coated diamond cutting tools.

According to the present invention, there is now provided a cemented carbide or cermet body coated with a CVD diamond layer of high diamond quality for which the diamond grains have been etched so as to achieve a less rough surface compared to the untreated layer. The diamond layer may have deposits of non-diamond material in the space between the diamond grains creating a very smooth surface. A CVD diamond coated cutting tool insert prepared in this way proves to give a prolonged tool life in machining operations of Al-alloys.

Figure 1:
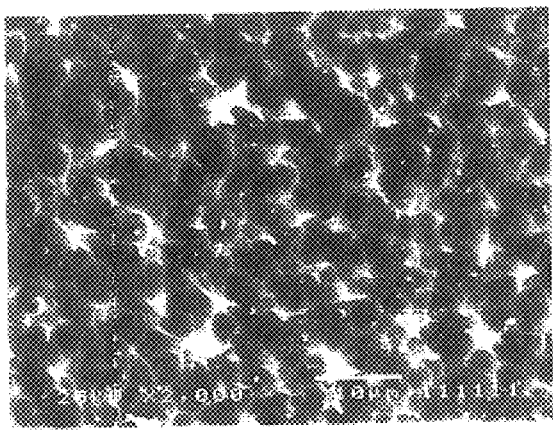
FIG. 1 shows in 1500× magnification the topography of the surface of a diamond layer etched according to the invention (a) and before etching (b).
Figure 1:
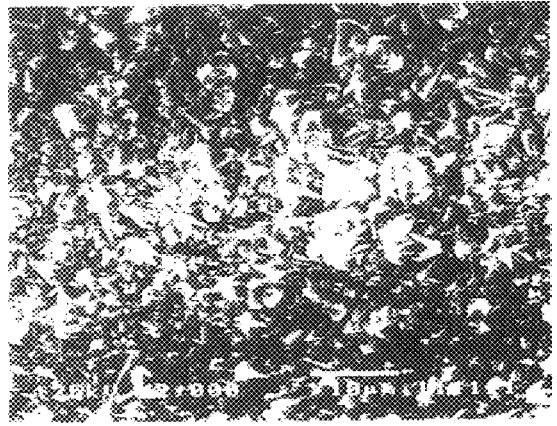
Figure 1:
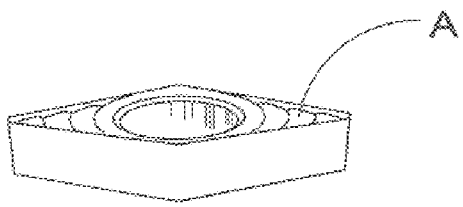

A three dimensional body according to the invention shows diamond coated surface with a topography as in FIG. 1a. The surface roughness is $R_a$<1.0 $\mu$m, preferably $R_a$<0.5 $\mu$m on the rake face as well as on the clearance faces. At least 80% of the surfaces fulfill the $R_a$ criterion for all cases. In a preferred embodiment, $R_a$ is <1.0 $\mu$m at all places on both the rake face and the clearance face, and preferably <0.5 $\mu$m.

Spotwise, in the space between the diamond grains there may exist a non-diamond material deposited during or prior to the RIE process. The material is preferably a non-diamond carbon material or a Si containing material. The size of the non-diamond containing spots are 0–5 $\mu$m, preferably 0–1 $\mu$m.

According to the present invention there is also provided a method for manufacturing of said body. The method involves reactive ion etching of diamond coated inserts in a gas plasma atmosphere using gases with oxygen or halogen content such as Cl or F containing gases, preferably HCl, $Cl_2$, $SF_6$ or $O_2$ and most preferably $CCl_4$. The etching of the diamond layer is effective at all sides of the body that are exposed to the plasma. Another method involves the deposition of an outer layer onto the diamond layer, which layer subsequently is etched away to a large extent. The layer material may be deposited by any CVD or PVD method, including deposition during a RIE process, or the deposition may be made by sol-gel technique. The preferred method of manufacturing involves dipping in a sol-gel medium, preferably containing $SiO_x$. The preferred method of drying the sol-gel coating involves spinning of the sol gel by using a rotating device onto which the body is fixed. The spinning device is then rotated with rotation speed up to 5000 rpm, preferably 1000–3000 rpm. The sol-gel application/spinning treatment may be repeated several times resulting in a multiple layer structure which fully covers the peaks of the underlying diamond coating. Subsequently, the body is heat treated at 300–500° C. The etching of a diamond coated insert provided with such an outer layer is preferably made using $O_2$ and/or $SF_6$ as the etching medium.

The etching method according to the invention involves typically a bias voltage at the sample of −200—−1000 V, preferably −400—−700 V. The gas pressure is 0.5–50 mtorr, preferably 1–30 mtorr and most preferably 2–15 mtorr.

The invention can be applied to diamond coated cutting tools, tools for rock drilling and wear parts as well as to other layers such as cBN layers deposited by CVD or PVD methods.

The invention is additionally illustrated in connection with the following Examples which are to be considered as illustrative of the present invention. It should be understood, however, that the invention is not limited to the specific details of the Examples.

EXAMPLE 1

A WC-6% Co cemented carbide insert provided with a chip breaker and with a cobalt depleted surface zone was diamond coated according to a standard coating procedure in a high current DC-arc diamond coating reactor to a diamond layer thickness of 10 μm. The insert was then etched during 1 h in an RIE etching device using $CCl_4$ as the reactant medium. The process parameters were:

p=9 mtorr $V_{bias}$=−500 V DC

FIG. 1a shows the diamond coated surface topography at the point in the chip breaker labelled 'A'.

As a reference insert a cemented carbide insert was prepared as described above but without the RIE treatment. FIG. 1b shows the diamond coated surface topography.

The two inserts were subjected to a turning test in an Al-9% Si alloy using the following cutting data:

v=300 m/min f=0.3 mm a=3 mm wet cutting intermittent cut

The RIE treated diamond coated insert generated a perfectly clean cut without any defects. For the non-etched insert small droplets of work-piece material remained on the machined surface. The size of the droplets was 50–100 μm and they occurred with a density of 50 pcs/mm² giving rise to a less shiny machined surface.

EXAMPLE 2

A WC-4% Co insert with a cobalt depleted surface zone was diamond coated to a layer thickness of 20 μm using a micro-wave plasma depositing method. The insert was then etched in an RIE-plasma in $Cl_2$ during 1.5 h at parameters:

p=2 mtorr $V_{bias}$=−430V DC

As a reference, a second insert was diamond coated as described above, but no RIE etching was applied.

The two inserts were subjected to a turning test in an Al-9% Si alloy using the following cutting data:

v=700 m/min f=0.3 mm a=1 mm wet cutting intermittent cut

The RIE treated diamond coated insert generated a perfect, defect-free cut while for the non-etched insert an inferior surface finish was obtained.

EXAMPLE 3

A WC-4% Co insert with a cobalt depleted surface zone was diamond coated to a layer thickness of 10 μm using a high current DC arc discharge depositing method. The insert was dipped in a $SiO_x$ gel, dried and then etched in an RIE-plasma in $O_2/SF_6$ during 2 h at parameters:

p=20 mtorr mass flow ratio $O_2/SF_6$=400

As a reference, a second insert was diamond coated as described above, but no RIE etching was applied.

The two inserts were subjected to a turning test in an Al-18% Si alloy using the following cutting data:

v=700 m/min f=0.1 mm a=1 mm wet cutting continuous cut

The RIE treated diamond coated insert generated a perfect, defect-free cut while for the non-etched insert an inferior surface finish was obtained.

EXAMPLE 4

A WC-4% Co insert with a cobalt depleted surface zone was diamond coated to a layer thickness of 20 μm using a high current DC arc discharge depositing method. $SiO_x$ sol-gel was applied to the diamond surfaces and the sol-gel was spun at 2500 rpm for 20s so as to generate a thin, homogeneous gel film. The sol-gel application/spinning treatment was repeated three times. The insert was heat treated at 425° C. for 60 min and then etched in an RIE-plasma in $O_2/SF_6$ during 30 min at parameters:

p=20 mtorr mass flow ratio $O_2/SF_6$=400

After etching the diamond coating surface roughness was Ra=30 nm measured with Atomic Force Microscopic technique (AFM). The measure area was 100×100 μm.

As a reference, a second insert was diamond coated as described above, but no RIE etching was applied. The diamond surface roughness for this insert was $R_a$=200 nm measured by AFM.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A coated cutting tool body comprising:
   a three dimensional body having a plurality of surfaces that intersect to form cutting edges; and
   at least one diamond layer formed on at least 80% of the surfaces, the at least one layer having etched diamond grains defining a polished surface, the polished surface having a surface roughness $R_a$ of less than 1.0 μm.

2. The body of claim 1 wherein said body includes a chipformer on a top surface of the body so as to provide chips formed during machining in a desired and controllable configuration.

3. The body of claim 1 wherein the diamond surface of such body contains spots of non-diamond material with a size of 0–5 μm.

4. The body of claim 3 wherein said spots of non-diamond material have a size of about 0–1 μm.

5. The body of claim 3 wherein the non-diamond material is carbon in a non-diamond configuration or a Si-containing material.

6. The body of claim 1 wherein the diamond layer is disposed on all of the surfaces which intersect to form cutting edges, the polished surface has a surface roughness less than 0.5 μm.

7. The body of claim 1 wherein the surface roughness of the diamond layer is less than 0.5 μm.

8. The body of claim 1, wherein the body comprises a rake face and a clearance face, the coating formed on both the rake face and the clearance face, the surface roughness on the entire rake face and clearance face is less than 1.0 μm.

9. The body of claim 8, wherein the surface roughness on the entire rake face and clearance face is less than 0.5 μm.

10. A coated cutting tool body comprising:

a three-dimensional body having a plurality of surfaces that intersect to form cutting edges;

at least one diamond layer formed on at least 80% of the surfaces;

the at least one layer having etched diamond grains defining a polished surface, the polished surface having a surface roughness $R_a$ of less than 1.0 μm; and an outer layer deposited onto the least one diamond layer.

11. Method for producing a smooth diamond layer on a complex shaped body comprising diamond coating the said body and then etching in a reactive ion etching device using RF plasma whereby the etching takes place at all sides of the body that are exposed to the plasma.

12. The method of claim 11 wherein the etching is made using gases with oxygen or halogen content.

13. The material of claim 12 wherein the said gas is $Ccl_4$.

14. The method of claim 11 wherein the etching is made after coating of the diamond coated body by one or several layers where the layer/layers preferably is/are Si and O containing layer/layers and the etching preferably is made using $O_2$ and/or $SF_6$ as etching medium.

15. The method of claim 14 wherein the layer applied on top of the diamond layer is applied by spinning a sol-gel at up to 5000 rpm.

16. The method of claim 15 wherein the diamond layer is applied by spinning a sol-gel at 1000–3000 rpm.

17. The method of claim 16 wherein the coated body is then heat-treated at 300–500° C.

18. The method of claim 7, wherein the etching is made at a pressure of 0.5–50 mtorr.

19. The method of claim 18 wherein etching is done at a pressure of 1–30 mtorr.

20. The method of claim 19 wherein etching is done at a pressure of 2–15 mtorr.

* * * * *